US009151783B2

United States Patent
Mkrtchyan et al.

(10) Patent No.: US 9,151,783 B2
(45) Date of Patent: Oct. 6, 2015

(54) GROUND OFFSET MONITOR AND COMPENSATOR

(75) Inventors: Edvard Mkrtchyan, Yerevan (AM); Dino Anthony Toffolon, Stoney Creek (CA); Adam Burns, Oakville (CA)

(73) Assignee: SYNOPSYS, INC., Mountain View, CA (US)

( * ) Notice: Subject to any disclaimer, the term of this patent is extended or adjusted under 35 U.S.C. 154(b) by 470 days.

(21) Appl. No.: 13/457,087

(22) Filed: Apr. 26, 2012

(65) Prior Publication Data

US 2013/0285641 A1 Oct. 31, 2013

(51) Int. Cl.
*H04L 25/06* (2006.01)
*G01R 19/10* (2006.01)
*G06F 1/26* (2006.01)

(52) U.S. Cl.
CPC .............. *G01R 19/10* (2013.01); *G06F 1/266* (2013.01); *H04L 25/062* (2013.01)

(58) Field of Classification Search
CPC ..... G01R 19/10; G06F 1/266; G06F 13/4068; H04L 25/061–25/064
USPC .......... 324/98–100; 307/43, 75, 103; 320/162–164; 326/21–34; 327/306–307, 318–319; 333/22 R, 24 R; 361/42, 43; 375/257, 316–319
See application file for complete search history.

(56) References Cited

U.S. PATENT DOCUMENTS

| 2,651,773 | A | * | 9/1953 | Loudon | 340/292 |
|---|---|---|---|---|---|
| 3,739,188 | A | * | 6/1973 | Froehling | 307/103 |
| 5,412,692 | A | * | 5/1995 | Uchida | 375/317 |
| 5,430,765 | A | * | 7/1995 | Nagahori | 375/318 |
| 5,539,779 | A | * | 7/1996 | Nagahori | 375/317 |
| 5,761,251 | A | * | 6/1998 | Wender | 375/345 |
| 5,818,672 | A | * | 10/1998 | Hilbe | 361/43 |
| 5,841,308 | A | * | 11/1998 | Nagata | 327/307 |
| 6,037,823 | A | * | 3/2000 | Arai et al. | 327/307 |
| 6,292,058 | B1 | * | 9/2001 | Ide et al. | 330/279 |
| 6,555,934 | B2 | * | 4/2003 | Miller | 307/103 |
| 6,735,260 | B1 | * | 5/2004 | Eliezer et al. | 375/316 |
| 6,768,334 | B1 | * | 7/2004 | Yamauchi et al. | 326/30 |
| 6,906,531 | B2 | * | 6/2005 | Mobley | 324/672 |
| 6,958,642 | B2 | * | 10/2005 | Johnson et al. | 327/307 |
| 7,058,315 | B2 | * | 6/2006 | Brewer et al. | 398/202 |
| 7,218,688 | B2 | * | 5/2007 | Nakano | 375/317 |
| 7,741,826 | B1 | * | 6/2010 | Fefer et al. | 323/284 |
| 7,768,439 | B2 | * | 8/2010 | Sunaga | 341/173 |
| 7,769,110 | B2 | * | 8/2010 | Momtaz | 375/317 |
| 2007/0108938 | A1 | * | 5/2007 | Veselic | 320/111 |
| 2010/0246722 | A1 | * | 9/2010 | Campeau | 375/319 |
| 2013/0259162 | A1 | * | 10/2013 | Qin et al. | 375/317 |

* cited by examiner

*Primary Examiner* — Huy Q Phan
*Assistant Examiner* — James Split
(74) *Attorney, Agent, or Firm* — Park, Vaughan, Fleming & Dowler LLP

(57) ABSTRACT

Methods and systems are described for monitoring and compensating an offset between a reference voltage used in a first device and a corresponding reference voltage used in a second device. The first device can include offset circuitry. The offset circuitry receives two voltage signals. The first voltage signal is equal to a first voltage value that is used as a reference voltage in the first device. The second voltage signal can be a time-varying voltage signal that has a known relationship with a second voltage value that is used as a reference voltage in the second device. The offset circuitry can then determine the second voltage value from the second voltage signal, and output an offset value based on a difference between the first voltage value and the second voltage value.

18 Claims, 3 Drawing Sheets

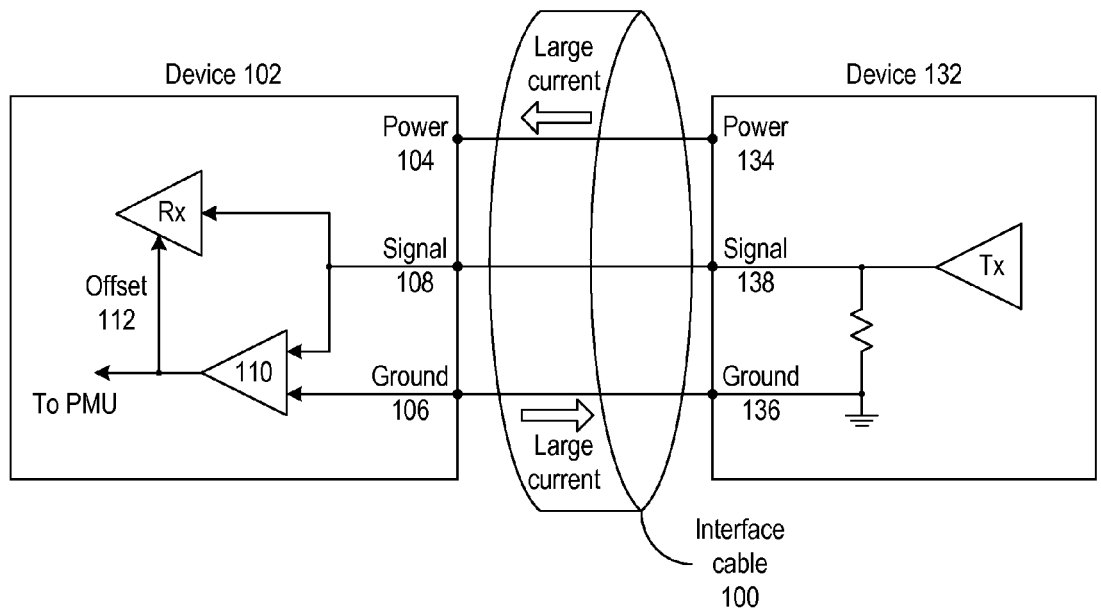
FIG. 1
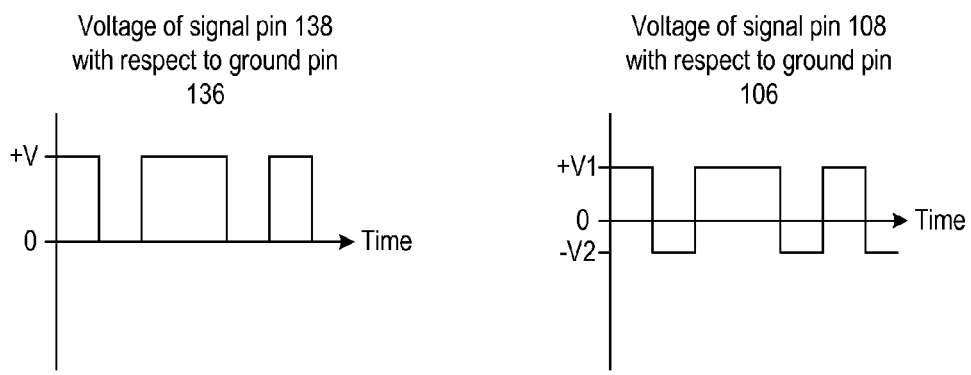
FIG. 2A
FIG. 2B

GROUND OFFSET MONITOR AND COMPENSATOR

TECHNICAL FIELD

This disclosure relates to electronic circuits. More specifically, this disclosure relates to circuitry to monitor and compensate ground offset.

BACKGROUND

Related Art

Battery-powered devices (e.g., mobile phones, smartphones, handheld computers, tablet computers, handheld multimedia devices, handheld game consoles, etc.) have become a part of everyday life. Many battery-powered devices can be coupled to other devices via an interface cable. For example, Universal Serial Bus (USB) 2.0 interface cables are commonly used to enable battery-powered devices to communicate with other devices (e.g., to enable a smartphone to communicate with a laptop).

Some interface cables (e.g., a USB 2.0 interface cable) also enable the battery-powered device to be charged. It is desirable to charge devices quickly. However, some interface cables are not designed to enable a battery-powered device to be charged quickly.

SUMMARY

A battery in a device can be charged quickly by using a large current. If a large current is drawn through an interface cable (e.g., a USB 2.0 interface cable), the difference between the voltages at the two ends of a conductor in the interface cable can be large enough to cause one or more devices coupled to the interface cable to malfunction and/or to cause adverse side effects.

An interface cable can include multiple conductors. In some embodiments, some of the conductors are used for charging the battery in the device, while other conductors are used for other purposes (e.g., for communicating information). The conductors that are used for charging the battery can carry a large current when the battery is being charge quickly, which can cause a large voltage drop across the conductors. However, other conductors that do not carry a large current may not experience a significant voltage drop. Some embodiments described herein determine the voltage drop caused by the large current by comparing the voltage of a conductor is carrying the large current with another conductor that is not carrying a large current, and use the voltage drop information to ensure that circuitry in the battery-powered device operates as desired.

Some embodiments described herein provide a circuit comprising: (1) a first node whose voltage is equal to a first voltage value that is used as a reference voltage in the circuit, (2) a second node to receive a voltage signal from a remote circuit, wherein for at least one time instance the voltage signal is equal to a second voltage value that is used as a corresponding reference voltage in the remote circuit, and (3) circuitry to output an offset value based on a difference between the first voltage value and the second voltage value.

Some embodiments provide a method that can be performed by a first device, wherein the method comprises: (1) receiving a first voltage value that is used as a reference voltage in the first device, (2) receiving a second voltage value that is used as a corresponding reference voltage in a second device that is electrically connected to the first device, and (3) determining an offset value based on the first voltage value and the second voltage value. The offset value can then be provided to a circuit in the first device that is expected to malfunction if a voltage offset between the reference voltage in the first device and the corresponding reference voltage in the second device is greater than a threshold.

BRIEF DESCRIPTION OF THE FIGURES

FIG. 1 illustrates a system in accordance with some embodiments described herein.

FIGS. 2A and 2B illustrate the voltages of some of the pins in two devices that are electrically connected using an interface cable in accordance with some embodiments described herein.

DETAILED DESCRIPTION

Figure 3A:
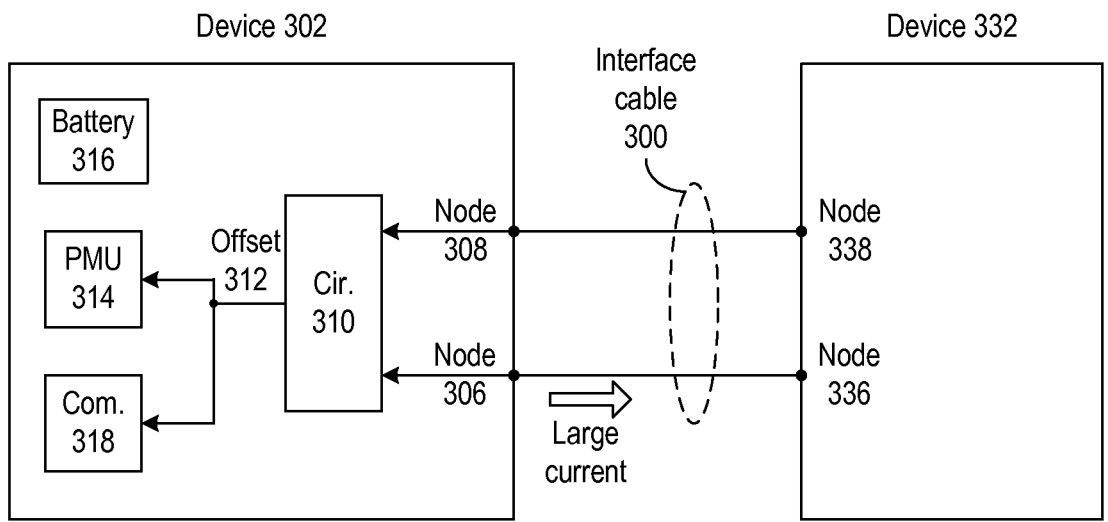
FIG. 3 illustrates a system in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

FIG. 1 illustrates a system in accordance with some embodiments described herein.

Device 102 can be any device that is capable of being charged. Device 132 can be any device that is capable of charging another device. For example, device 102 can be a smartphone, and device 132 can be a laptop or a desktop computer. Device 102 and device 132 are coupled through interface cable 100, which enables device 132 to communicate with and charge device 102. Although FIG. 1 shows three conductors in interface cable 100, an interface cable often includes more than three conductors.

The term "interface cable" refers to a group of conductors that are used for interfacing two or more devices with one another. An interface cable is not limited to a particular physical structure. In general, an interface cable can have any physical structure that enables two or more devices to be electrically connected to one another. For example, an interface cable can have two or more end-points, wherein each end-point provides a structure that can be used to electrically connect a device. The group of conductors in an interface cable may be bundled to form a single long structure, or each conductor may be physically separate, or the conductors may be bundled in arbitrary subgroups to form multiple long structures.

The pins corresponding to the three conductors in interface cable 100 are shown in FIG. 1. Power pin 104, ground pin 106, and signal pin 108 on device 102 are coupled to power pin 134, ground pin 136, and signal pin 138, respectively, on device 132. In some embodiments, signal pin 108 and signal pin 138 are data pins, i.e., these pins are used to transfer data between device 102 and device 132.

When device 132 charges device 102 using a large current, the large current flows from power pin 134 to power pin 104, and back from ground pin 106 to ground pin 136. The large current flowing from ground pin 106 to ground pin 136 can cause the voltage of ground pin 106 to be non-negligibly higher than the voltage of ground pin 136.

The offset in the ground voltages of the two devices can cause circuitry on either or both of the two devices to malfunction. For example, transmitter Tx in the device 132 can transmit a signal through signal pins 138 and 108 to device 102. The signal can then be received by receiver Rx in the device 102. FIGS. 2A and 2B illustrate the voltages of some of the pins in the two devices in accordance with some embodiments described herein.

FIG. 2A illustrates the voltage of signal pin 138 with respect to ground pin 136 in accordance with some embodiments described herein. The voltage of signal pin 138 varies between +V volts and 0 volts when measured with respect to the ground pin voltage 136.

FIG. 2B illustrates the voltage of signal pin 108 with respect to ground pin 106 in accordance with some embodiments described herein. Due to the voltage offset between ground pins 136 and 106, the voltage of signal pin 108 varies between +V1 volts and −V2 volts when measured with respect to ground pin 106.

The offset between the ground voltages of ground pins 136 and 106 is equal to V2 volts in the example shown in FIGS. 2A and 2B. If V2 is large enough, the offset may cause adverse side effects, e.g., a receiver may not correctly interpret the signal that was sent from transmitter Tx. Note that FIG. 2B assumes that signal pin 108 is not terminated. If signal pin 108 is terminated, the voltage values would be different. In any case, regardless of whether or not a device has receiver termination, a large offset between the ground voltages can cause adverse side effects.

In some embodiments described herein, device 102 includes offset circuit 110 that receives two inputs. A first input is received from signal pin 108, and a second input is received from ground pin 106. Offset circuit 110 then determines the voltage offset between ground pins 106 and 136 based on these two inputs.

In some embodiments, the voltage drop across the conductor that connects signal pins 138 and 108 is negligible. Further, in these embodiments, it is known that the voltages of signal pins 138 and 108 vary between a positive voltage value and 0 when the voltage is measured with respect to the voltage of the ground pin 136. In these embodiments, offset circuit 110 can sample the voltage of signal pin 108 at multiple time instances to obtain a set of voltage samples. Next, offset circuit 110 can determine the lowest voltage value from the set of voltage samples. Note that the lowest voltage value corresponds to the voltage of ground pin 136. Offset circuit 110 can then output an offset value based on the difference between the lowest voltage value in the set of voltage samples and the voltage of ground pin 106. In some embodiments, offset circuit 110 can determine the lowest voltage value in the time-varying signal received from signal pin 108 by using peak voltage detection circuitry.

The offset value can then be used to adjust the behavior of any circuitry that is adversely affected by an offset in the ground voltages of the two devices. Specifically, as shown in FIG. 1, offset 112 can be provided to receiver Rx to correctly interpret the voltage signal received on signal pin 108. For example, receiver Rx may use offset 112 to adjust the threshold voltage of a data slicer that is used for interpreting the voltage signal received on signal pin 108. Offset 112 can also be provided as an input to a power management unit that, among other things, controls the amount of current that is being used for charging a battery.

FIG. 3 illustrates a system in accordance with some embodiments described herein.

Device 302 is coupled to device 332 via interface cable 300 which may include multiple conductors. One conductor electrically connects node 308 with node 338, and another conductor electrically connects node 306 with node 336. Interface cable 300 can have more conductors, which are not shown in FIG. 3 for the sake of clarity and ease of discourse. The conductor that electrically connects nodes 308 and 338 does not have a large voltage drop across the conductor. However, the conductor that electrically connects nodes 306 and 336 has a large voltage drop across the conductor. The term "large voltage drop" refers to a voltage drop that is sufficiently large to cause malfunctioning and/or adverse side effects in device 302 and/or 332.

Circuitry 310 receives at least two inputs. One input is the voltage signal from node 308 and the other input is the voltage signal from node 306. Nodes 306 and 308 are typically electrically connected to other circuit blocks, but they have not been shown in FIG. 3 for the sake of clarity and ease of discourse. Circuitry 310 outputs an offset value 312 based on the two voltage signals. The offset value 312 represents the voltage drop between nodes 306 and 336, and can be used by any circuitry that is expected to malfunction if the voltage drop across the conductor that connects nodes 306 and 336 is greater than a threshold. For example, communication circuitry 318 can use offset value 312 to adjust how information is received and/or transmitted. In some embodiments, the offset value can be provided to a receiver so that the receiver can correctly interpret information encoded in the voltage signal. Offset value 312 can also be used by power management unit 314 to adjust the amount of current that is used for charging battery 316. In some embodiments, offset value 312 can be stored in a register.

In some embodiments, node 306 can be at a voltage $V_R$ that is used as a reference voltage in device 302, and node 336 can be at a corresponding reference voltage in device 332. For example, in some embodiments, voltage $V_R$ can be ground in device 302 and node 336 can be ground in device 332.

In some embodiments, node 308 can receive a time-varying voltage signal from node 338, e.g., a data or clock signal. The relationship between the time-varying voltage signal and the reference voltage that is used in device 332 (e.g., the voltage of node 336) may be known. In some embodiments, circuit 310 can determine the reference voltage that is used in device 332 from the time-varying voltage signal received on node 308 based on this relationship. For example, in some embodiments, it is known that an extremum voltage value (minimum or maximum—depending on the embodiment) of the time-varying voltage signal is equal to the reference voltage value. In these embodiments, circuitry 310 can determine the extremum voltage value of the time-varying voltage signal and use the extremum voltage value as a proxy for the reference voltage that is used in device 332.

In some embodiments, it is known that the average voltage value or the average of the maximum and the minimum voltage values is equal to the reference voltage value. In these embodiments, circuitry 310 can accordingly determine the reference voltage from the time-varying voltage signal.

In some embodiments, the time-varying voltage signal is a differential signal, and the reference voltage is the common-mode voltage. In these embodiments, the time-varying voltage signal is received on two nodes instead of one node (node 308) as shown in FIG. 3A. Circuitry 310 can receive the signal from these two nodes as inputs and determine the common-mode voltage by averaging the voltages of the differential signal (e.g., by using a voltage bridge).

In some embodiments, circuitry 310 can include: (1) circuitry to determine multiple voltage samples by sampling the time-varying voltage signal at multiple time instances, and (2) circuitry to determine the reference voltage value that is used in device 332 based on the multiple voltage samples. Exactly how circuitry 310 determines the reference voltage value depends on the relationship between the time-varying voltage signal and the reference voltage in device 332. As explained above, some examples of how the reference voltage value can be determined include determining the maximum voltage value, the minimum voltage value, the average voltage value, or the average of the minimum and the maximum voltage values. These examples have been provided for illustration purposes only and are not intended to limit the embodiments to the forms disclosed. Many variations and modifications will be apparent to those skilled in the art.

Figure 3B:
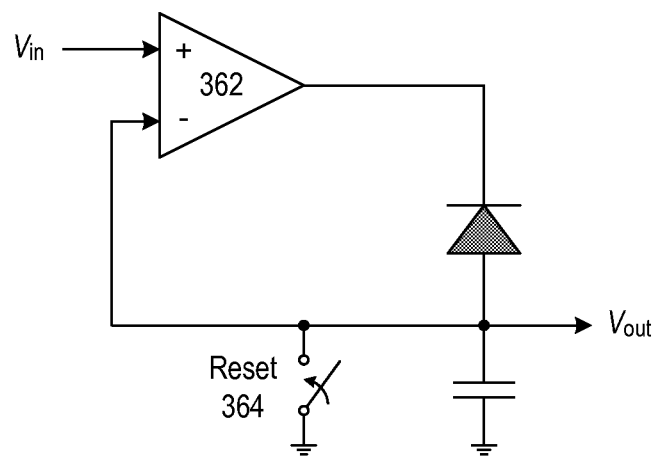

In some embodiments, circuitry 310 can include circuitry to detect a peak voltage in a time-varying voltage signal. The peak voltage value can then be used to determine the reference voltage of device 332. For example, the circuitry to detect the peak voltage can be used to detect the voltage −V2 in the time-varying voltage signal shown in FIG. 2B. The peak voltage value can then be used to determine the offset voltage (e.g., V2). Peak detection circuitry is well known in the art. FIG. 3B illustrates circuitry to detect a peak voltage in a time-varying voltage signal in accordance with some embodiments described herein. When $V_{in}$ is less than $V_{out}$, operational amplifier discharges the capacitor by driving a current through the diode until $V_{in}$ and $V_{out}$ are equal. The capacitor continues to hold the peak voltage until $V_{in}$ is again less than $V_{out}$. Reset switch 364 can be used to reset the peak voltage circuit. The circuitry shown in FIG. 3B detects the negative peak voltage. To detect the positive peak voltage, the diode can be reversed, i.e., the anode of the diode can be coupled to the operational amplifier 362's output instead of the output node ($V_{out}$). The circuit shown in FIG. 3B is for illustrations purposes only and is not intended to limit the embodiments to the forms disclosed.

Figure 4:
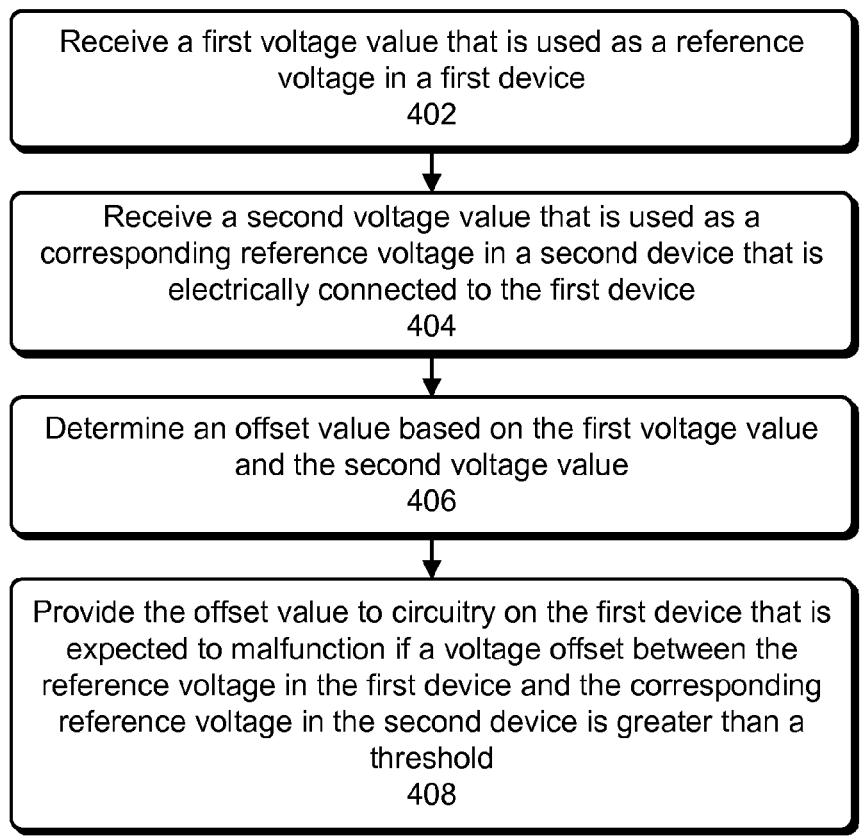
FIG. 4 illustrates a process for determining an offset in accordance with some embodiments described herein.

FIG. 4 illustrates a process for determining an offset in accordance with some embodiments described herein.

The process is performed by a first device (e.g., device 302) and begins by receiving a first voltage value that is used as a reference voltage in the first device (operation 402). Next, a second voltage value is received that is used as a corresponding reference voltage in a second device (e.g., device 332) that is electrically connected to the first device (operation 404). As explained above, a relationship between a signal (e.g., a time-varying data signal) received from the second device and the reference voltage used in the second device may be known. This relationship can be used to determine the second voltage value from the signal received from the second device. An offset value based on the first voltage value and the second voltage value is then determined (operation 406). Next, the offset value is provided to circuitry on the first device that is expected to malfunction if a voltage offset between the reference voltage in the first device and the corresponding reference voltage in the second device is greater than a threshold (operation 408).

Figure 5:
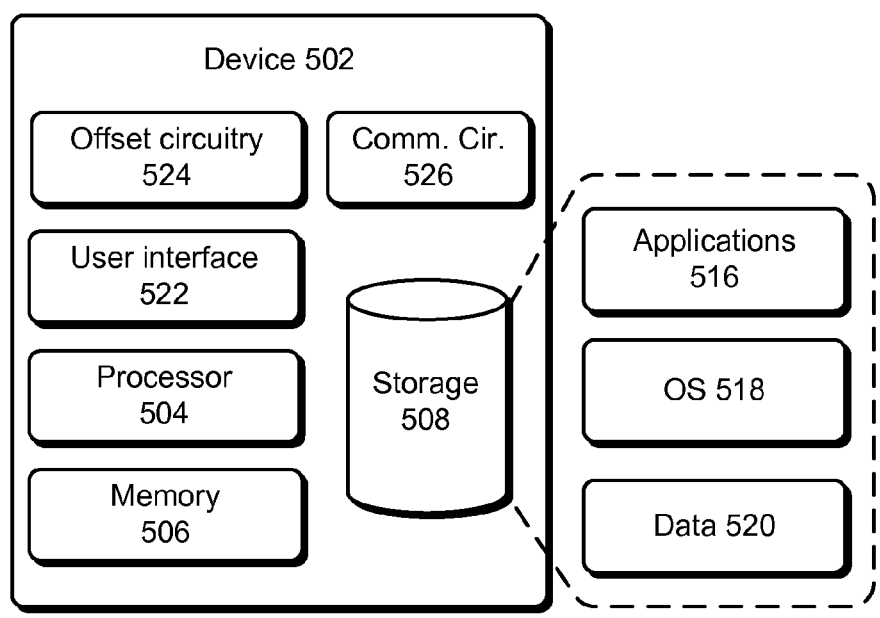
FIG. 5 illustrates a device in accordance with some embodiments described herein.

FIG. 5 illustrates a device in accordance with some embodiments described herein.

A device can generally be any hardware-based mechanism that is capable of performing computations. In some embodiments, device 502 can include processor 504, memory 506, storage 508, user interface 522, communication circuitry 526, and offset circuitry 524. Storage 508 can store one or more applications 516, an operating system 518, and data 520. Operating system 518 and/or one or more applications 516 can be loaded (partially or fully) into memory 506, and processor 504 can execute the operating system 518 and/or one or more applications 516. User interface 522 can be used to interact with a user. Communication circuitry 526 can be used to communicate with another device through an interface cable. Offset circuitry 524 can be used to determine an offset voltage (e.g., a ground offset) between a reference voltage used in device 502 and a corresponding reference voltage used in another device that is electrically coupled to device 502 through an interface cable.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A circuit, comprising:
    a first node whose voltage is equal to a first voltage value that is used as a reference voltage in the circuit;
    a second node to receive a voltage signal from a remote circuit, wherein a relationship exists between the voltage signal and a second voltage value that is used as a corresponding reference voltage in the remote circuit;

circuitry to determine the second voltage value from the voltage signal based on the relationship;
circuitry to output an offset value based on a difference between the first voltage value and the second voltage value; and
circuitry to provide the offset value to a receiver, wherein the receiver uses the offset value to adjust a threshold voltage of a data slicer that is used to interpret information encoded in the voltage signal.

2. The circuit of claim 1, wherein the circuitry to output the offset value includes:
circuitry to determine multiple voltage samples by sampling the voltage signal at multiple time instances; and
circuitry to determine the second voltage value based on the multiple voltage samples.

3. The circuit of claim 1, wherein the circuitry to output the offset value includes circuitry to detect a peak voltage in a time-varying voltage signal.

4. The circuit of claim 1, wherein the circuit is part of a first device, wherein the remote circuit is part of a second device, wherein pins on the first device are electrically connected to corresponding pins on the second device using an interface cable, and wherein the second device charges the first device through the interface cable.

5. The circuit of claim 4, wherein the interface cable is a Universal Serial Bus (USB) 2.0 interface cable.

6. The circuit of claim 4, wherein the first node is electrically connected to a ground pin on the first device, and wherein the ground pin on the first device is electrically connected to a corresponding ground pin on the second device through the interface cable.

7. The circuit of claim 4, wherein the second node is electrically connected to a data pin on the first device, and wherein the data pin on the first device is electrically connected to a corresponding data pin on the second device through the interface cable.

8. The circuit of claim 1, further comprising circuitry to provide the offset value to power management circuitry that controls a charging current.

9. A device, comprising:
a battery; and
a circuit, comprising:
a first node whose voltage is equal to a first voltage value that is used as a reference voltage in the device;
a second node to receive a voltage signal from a remote device, wherein a relationship exists between the voltage signal and a second voltage value that is used as a corresponding reference voltage in the remote device;
circuitry to determine the second voltage value from the voltage signal based on the relationship;
circuitry to output an offset value based on a difference between the first voltage value and the second voltage value; and
circuitry to provide the offset value to a receiver, wherein the receiver uses the offset value to adjust a threshold voltage of a data slicer that is used to interpret information encoded in the voltage signal.

10. The device of claim 9, wherein the circuitry to output the offset value includes:
circuitry to determine multiple voltage samples by sampling the voltage signal at multiple time instances; and
circuitry to determine the second voltage value based on the multiple voltage samples.

11. The device of claim 9, wherein the circuitry to output the offset value includes circuitry to detect a peak voltage in a time-varying voltage signal.

12. The device of claim 9, wherein pins on the device are electrically connected to corresponding pins on the remote device using an interface cable, and wherein the remote device provides a current through the interface cable to charge the battery.

13. The device of claim 12, wherein the interface cable is a Universal Serial Bus (USB) 2.0 interface cable.

14. The device of claim 12, wherein the first node is electrically connected to a ground pin on the device, and wherein the ground pin on the device is electrically connected to a corresponding ground pin on the remote device through the interface cable.

15. The device of claim 12, wherein the second node is electrically connected to a data pin on the device, and wherein the data pin on the device is electrically connected to a corresponding data pin on the remote device through the interface cable.

16. The device of claim 9, further comprising circuitry to provide the offset value to power management circuitry that controls a charging current that is used to charge the battery.

17. A method, comprising:
receiving a first voltage value that is used as a reference voltage in a first device;
receiving a voltage signal from a second device that is electrically connected to the first device through an interface cable, wherein a relationship exists between the voltage signal and a second voltage value that is used as a corresponding reference voltage in the second device;
determining the second voltage value from the voltage signal based on the relationship;
determining an offset value based on a difference between the first voltage value and the second voltage value;
adjusting a threshold voltage of a data slicer based on the offset value; and
interpreting information encoded in a voltage signal using the data slicer.

18. The method of claim 17, further comprising providing the offset value to circuitry in the first device that is expected to malfunction if a voltage offset between the reference voltage in the first device and the corresponding reference voltage in the second device is greater than a threshold.

* * * * *